United States Patent [19]

Matthews et al.

[11] Patent Number: 4,532,427
[45] Date of Patent: Jul. 30, 1985

[54] METHOD AND APPARATUS FOR PERFORMING DEEP UV PHOTOLITHOGRAPHY

[75] Inventors: John C. Matthews, Columbia; Michael G. Ury, Bethesda; Charles H. Wood, Rockville; Marshal Greenblatt, Silver Spring, all of Md.

[73] Assignee: Fusion Systems Corp., Rockville, Md.

[21] Appl. No.: 362,825

[22] Filed: Mar. 29, 1982

[51] Int. Cl.³ .............................................. H01J 65/04
[52] U.S. Cl. .............................. 250/492.2; 250/504 R; 315/248; 430/311
[58] Field of Search ............... 315/39, 248; 250/492.2, 250/504; 430/311

[56] References Cited

U.S. PATENT DOCUMENTS

| | | | |
|---|---|---|---|
| 3,518,083 | 6/1970 | Touchy | 96/33 |
| 3,596,083 | 7/1971 | Lovering | 240/41 R |
| 3,695,758 | 10/1972 | Tanaka | 355/71 |
| 3,860,335 | 1/1975 | Caprari | 353/102 |
| 3,872,349 | 3/1975 | Spero et al. | 315/39 |
| 3,943,403 | 3/1976 | Haugsjaa et al. | 315/39 |
| 3,993,927 | 11/1976 | Haugsjaa et al. | 315/39 |
| 4,041,352 | 8/1977 | McNeill et al. | 315/248 |
| 4,042,850 | 8/1977 | Ury et al. | 315/39 |
| 4,215,935 | 8/1980 | Loebach | 355/67 |
| 4,485,332 | 11/1984 | Ury et al. | 315/248 X |

FOREIGN PATENT DOCUMENTS 55-102169  8/1980  Japan .

OTHER PUBLICATIONS

"Optical Lithography in the 1-$\mu$m Limit" by Daryl Ann Doane, Solid State Technology, Aug. 1980, pp. 101-114.
"A Practical Multilayer Resist Process for 1 $\mu$m Lines" by Batchelder et al, Semiconductor International, Apr. 1981, pp. 214-218.
"Deep UV Lithography" by Burn Jeng Lin, Vac. Sci. Technol., vol. 12, No. 6, Nov./Dec. 1975, pp. 1317-1320.
"A Novel Exposure System for High-Resolution Deep UV Lithograpy" by F. Caprari and D. A. Doane. Fusion Systems information packet.

Primary Examiner—Alfred E. Smith
Assistant Examiner—Jack I. Berman
Attorney, Agent, or Firm—Pollock, Vande Sande & Priddy

[57] ABSTRACT

A method and apparatus for performing deep UV photolithography which utilizes a microwave generated electrodeless light source for producing deep UV radiation. This results in faster semiconductor exposure times and less system downtime for changing failed bulbs as well as other advantages which are detailed herein.

7 Claims, 6 Drawing Figures

METHOD AND APPARATUS FOR PERFORMING DEEP UV PHOTOLITHOGRAPHY

This invention is in the art of photolithography and is directed to an improved method of an apparatus for performing deep UV photolithography.

BACKGROUND OF THE INVENTION

As is well known, photolithography is a technique which in recent years has facilitated more effective and inexpensive manufacture of semiconductor devices, such as transistors and integrated circuits. Such semiconductor devices are the building blocks of virtually all consumer, industrial, and military electronic apparatus today, including computers, calculators, automated equipment, and televisions, which collectively have done much to improve the quality of life in our country in recent years.

In the practice of photolithography, a pattern in an optical mask, which corresponds to the features of the integrated circuit to be manufactured, is imaged onto a semiconductor wafer with ultraviolet light (UV). The wafer is coated with a UV-sensitive photoresist, which changes chemically during exposure to the UV light over areas determined by the pattern in the mask. After exposure, the photoresist is developed, and the semiconductor wafer is further processed by etching away areas determined by the imaged pattern and by depositing impurities. The process may be repeated on the wafer until the desired transistor device or integrated circuit is fabricated.

The light source which is used to provide the ultraviolet light for conventional photolithography is typically an electrode arc lamp with a mercury fill in which the radiation is provided by an arc discharge which occurs between two electrodes in the lamp envelope. For exposure of conventional photoresists, the lamp provides radiation at the conventional UV wavelength of 260-460 nm.

A goal in the fabrication of integrated circuit is to reduce the size of circuit features as much as possible so that more or faster circuit components may be included in a single integrated circuit chip of a given size. Thus, it is generally recognized that a computer of today which is small enough to be placed on a table has as much computational power as a room-size computer of a generation ago, with a corresponding reduction in cost. This tremendous reduction in size and cost has largely been made possible by the ascendancy of integrated circuit technology, including the photolithographic techniques discussed above, which have permitted the printing of microscopic circuit features.

It is of course desired to continue in the same direction to provide integrated circuits having even greater component densities. However, it has been discovered that as the resolution of imaged lines approaches 1 $\mu$m in width, the conventional UV wavelengths are too long, and results in diffraction effects which impair effective imaging. This can be intuitively understood when it is appreciated that at such narrow line widths, the mask slits themselves are closer in dimension to the wavelength of the light being used, which influences the behavior of the light as it passes through the slits.

To solve this problem it is necessary to use an imaging medium having a shorter wavelength than conventional ultraviolet. While several approaches have been proposed, including the exploratory technologies of x-ray and e beam, the most promising of these is use of deep ultraviolet light (190-260 nm). It is preferred to the exploratory technologies, since a substantial part of the deep UV system configuration, including for example, masks and alignment apparatus are already available from conventional ultraviolet.

Also, apart from its use to print high resolution lines of submicrometer width, deep UV may be advantageously used to improve imaging when printing lines of conventional resolution. Thus, as known to those skilled in the art, use of shorter wavelengths results in a greater depth of focus at the wafer and maximizes the probability of sharp printing even when the mask and wafer are not precisely positioned.

For the above reasons, for the last several years, substantial effort has gone into developing a successful deep UV photolithography system. A suitable deep UV photoresist known as polymethyl methacrylate (PMMA) has been developed and is in use. However, the one problem which has eluded solution, and which has kept deep UV from realizing its potential for providing integrated circuits of greater packing density, has been the lack of a satisfactory light source. The limitations of existing light sources for deep UV photolithography have been well documented, e.g., see "Optical Lithography in the 1 $\mu$m Limit" by Daryl Ann Doane, *Solid State Technology*, August 1980, Pp. 101-114 and "A Practical Multilayer Resist Process for 1 $\mu$m Lines" by Batchelder et al, Semiconductor International, April, 1981, Pp. 214-218.

The primary problem has been the inability of workers in the art to provide a light source having sufficient brightness in the deep UV part of the spectrum to effect rapid on-line exposure of deep UV photoresists. This has resulted in unacceptably long processing times and consequent low yield per unit time of completed semiconductor devices. Thus, presently the source which is most widely used for deep UV applications converts less than 2% of its input power to output radiation in the deep UV part of the spectrum. Additionally, this source has a relatively short operating lifetime of only about 100 hours, which has resulted in frequent downtime for the purpose of changing lamps. Additionally, a number of other types of deep UV sources have been tried, but these have also resulted in relatively low deep UV output, and typically have been hampered by other problems and disadvantages, such as nonuniform light output, a spectral output which deteriorates rapidly with age, and the necessity for critical positioning.

The literature discloses that the following light sources have been used or considered for deep UV photolithography:

(1) The xenon-mercury (Xe-Hg) compact arc lamp is the primary source which has been used, and is a high pressure electrode arc lamp. It is similar to the mercury compact arc lamp which is used for conventional UV photolithography with the addition of xenon in the fill to alter the spectrum towards the deep UV. However, even with such addition, only a very small portion of the lamp output falls within the desired 190-260 nm range. Thus, the lamp must be run at very high power levels to extract what deep UV is possible, but even so, exposure time is longer than desired. Additionally, the high power levels at which the lamp must be operated contribute to rapid aging, resulting in degradation of the spectrum produced and the necessity of too-frequent bulb replacement.

(2) The pulsed xenon lamp is a low-medium pressure arc lamp driven by short, high energy pulses, which delivers a continuum from 200-315 nm, and has about 6% of its output between 200-260 nm. Relatively non-uniform light output and production of radio frequency interference have limited application of this lamp.

(3) The deuterium lamp produces a continum in the region of 200-315 nm, but it has been found that output levels are too low for practical application.

(4) The pulsed mercury lamp is a high pressure arc lamp which is driven with short, high energy pulses. It provides a continuum between 200 and 300 nm, but lacks repeatability and suffers from short life.

(5) Doped lamps are typically compact arc sources with enhanced spectral emissions produced by doping lamp materials during manufacture. It has been found that this type of lamp tends to be inconsistent in output, and has a short life span.

(6) Low power sources such as flourescent or germicidal lamps which have a significant part of their spectral output in the deep UV have been considered. However, the output power and brightness, i.e., (output power)/surface area, of these sources is not sufficient for photoresist exposure.

In addition to the above considerations, it is important to appreciate that all of the prior sources which have been used are lamps which include electrodes, and which emit light by generating an arc discharge between such electrodes. The generated arc is typically longer than it is wide, and is a non-uniform unstable emitter of radiation. The problems which are engendered by the existence of the arc discussed in Lovering U.S. Pat. No. 3,569,083, and for example have made mandatory the use of an optical integrator to uniformly redistribute the light before it is incident on the wafer. Further, since the arc is treated optically as a point source, the arc lamp must be positioned within extremely critical tolerances for suitable imaging.

It is the purpose of the present invention to provide a method and apparatus for performing deep UV photolithography using an improved light source, and more particularly a bright light source which has a substantial output in the deep UV part of the spectrum, resulting in much more rapid exposure of deep UV photoresists than in the prior art. Thus, it is anticipated that with the use of the present invention, the time necessary for such exposure is only a fifth to a tenth of that required by prior art systems. Additionally, the invention provides a light source having substantially longer lifetime than the other sources discussed, and overcomes others of the problems and disadvantages associated with such sources. More specifically, the objects of the invention are as follows:

It is an object of the invention to provide a method and apparatus for performing deep UV photolithography utilizing a light source which has a greater output in the deep UV part of the spectrum than sources heretofore used.

It is a further object of the invention to provide a method and apparatus which is capable of printing narrow lines on semiconductor wafers with shorter exposure times and consequently greater speed than has heretofore been possible.

It is still a further object of the invention to provide a method and apparatus for performing deep UV photolithography utilizing a light source which is more efficient than those heretofore used.

It is still a further object of the invention to provide a method and apparatus which utilizes a deep UV source which has a more uniform output than prior sources used, and which permits elimination of the optical integrating means typically used in the optical trains of such systems.

It is still a further object of the invention to provide a method and apparatus in which lamp bulbs fail less frequently than in prior art systems, thereby requiring less down time for bulb replacement.

It is still a further object of the invention to provide a method and apparatus which does not require critical source placement.

It is still a further object of the invention to provide a method and apparatus which utilizes a deep UV source having a spectrum which does not deteriorate greatly with age.

BRIEF SUMMARY OF THE INVENTION

In accordance with the invention the above objects are accomplished by using a microwave generated electrodeless lamp as the light source for performing deep UV photolithography.

Unlike the electrode arc lamps discussed above, the source disclosed herein is electrodeless. The bulb envelope is filled with a plasma forming medium, such as mercury in a noble gas, and is disposed in a metallic chamber to which microwave energy is supplied. This energy excites a plasma substantially throughout the volume of the envelope, which emits ultraviolet radiation which escapes through an ultraviolet transmissive window in the chamber.

It has been found that the radiation which is emitted by such electrodeless lamps is much richer in the deep UV part of the spectrum than in the case of the arc lamps heretofore used. It is believed that the absence of electrodes permits operation of the lamp in a regime which is favorable for deep UV production.

Further, the light source disclosed herein is a relatively bright deep UV source, where brightness is light output per unit of emitting surface area. Since the photoresist must be exposed with a certain minimum amount of light flux per unit area, the required source must not only produce a high total amount of deep UV but must produce it with a certain minimum brightness for efficient optical transfer to the photoresist area.

BRIEF DESCRIPTION OF THE DRAWINGS

The invention will be better understood by referring to the accompanying drawings in which:

FIG. 3 is a schematic representation of an electrode arc lamp such as is used in the prior art system, while

DETAILED DESCRIPTION OF THE INVENTION

Figure 1:
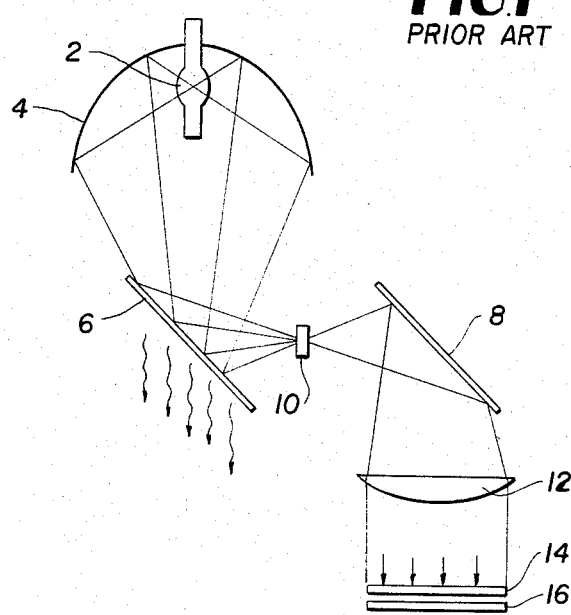
FIG. 1 is an illustration of a system for performing deep UV photolithography in accordance with the prior art, which utilizes an arc light source having electrodes.

Referring to FIG. 1, an exemplary prior art system for performing deep UV photolithography is shown. It is comprised of XeHg electrode arc source 2, elliptical reflector 4, first and second dichroic mirrors 6 and 8, optical integrating means 10, and collimating lens 12.

The arc source 2 is located at a focus of elliptical reflector 4 and light energy is reflected from dichroic mirror 6 to a second focus, where is made spatially uniform by optical integrator 10. After reflecting from dichroic mirror 8, the light is fed through collimating lens 12, which delivers a parallel, relatively uniform beam of light to mask 14 and semiconductor wafer 16 at the exposure plane. The function of dichroic mirrors is to remove the infrared component of the light by causing it to be transmitted, while the ultraviolet component is reflected.

As has been discussed above, due to the fact that a better deep UV source for photolithography has heretofore not been known, the exemplary prior art system shown in FIG. 1 has not provided the desired performance. Also, while other specific optical trains using additional or different reflectors and lenses have been used in connection with arc lamps, e.g. see Caprari U.S. Pat. No. 3,860,335, these suffer from the same difficulties.

The most important problem with the XeHg arc source is that less than 2% of the applied input power is converted to spectral output in the 190–260 nm region, thus making it an extremely inefficient source for deep UV photolithography. This has caused unduly long exposure times on the order of numbers of minutes, resulting in low relative yields of completed semiconductor devices. Further aggravating this problem is the fact that the source has a short lifetime of only about 100 hours, thus necessitating frequent replacement, which results in system downtime and which further slows down production.

Additionally, the prior art source (1) has a spectral output which deteriorates relatively rapidly with age; (2) provides a spatially non-uniform light output which makes the use of an optical integrating means mandatory; and (3) since the arc is essentially a point source, requires critical placement (e.g. placement with the arc at the focus of an ellipse), which may complicate and slow down installation of replacement lamps.

Figure 2:
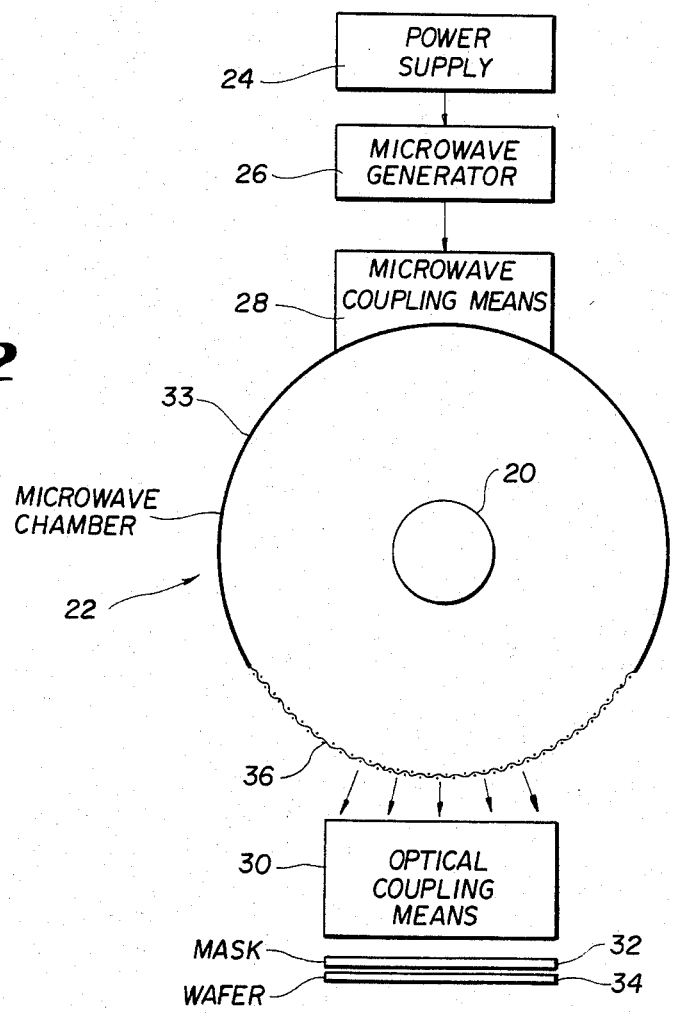
FIG. 2 is an illustration of a system for performing deep UV photolithography in accordance with the present invention, which utilizes an electrodeless light source.

In contrast thereto, referring to FIG. 2, an illustration of a deep UV photolithography system in accordance with the present invention is depicted. The heart of the system is an electrodeless light source which is comprised of deep UV-transmissive lamp envelope 20 and microwave chamber 22 in which the lamp envelope is physically disposed. Also shown are power supply 24, microwave generator 26, microwave coupling means 28, and optical coupling means 30.

The lamp envelope 20 is filled with a plasma forming medium, typically Hg in a noble gas at a relatively low pressure. When microwave energy is coupled to the envelope it generates a plasma or hot gas therein, which emits ultraviolet light. In the figure, power supply 24 supplies electrical power to microwave generator 26, typically a magnetron, which generates electromagnetic energy in the microwave frequency range. This energy is coupled to the microwave chamber by a transmission line and coupling slot in the chamber or possibly by direct insertion of the microwave generator. The microwave energy in the chamber couples to lamp envelope 20, and generates the plasma. The ultraviolet light emitted thereby is transferred by optical coupling means 30 to mask 32, and semiconductor wafer 34 at the exposure plane to effect exposure of a deep UV photoresist which is coated on the wafer.

The microwave chamber 22 is comprised of a solid conductive portion 33, typically made of a conductive metal, and a conductive mesh portion 36. The mesh is arranged to be fine enough to keep substantially all of the microwave energy in the chamber, but does not prevent the ultraviolet light from exiting therefrom. In the illustration, the solid portion of the chamber is a portion of a sphere, although other chamber shapes, for example cylindrical and other geometric shapes are possible. Additionally, the lamp envelope is shown as being spherical, although other shapes may be possible for it also.

The optical coupling means is typically comprised of a number of lenses for efficiently transferring the ultraviolet energy to the wafer plane, although in some embodiments it may merely be air. The invention is applicable to all of the various types of photolithography including contact printing, proximity printing and projection printing, depending on the configuration of the optical coupling means. To enhance light output, a portion of the interior of the microwave chamber may be coated with deep UV-reflecting material.

The salient advantage of the photolithography system shown in FIG. 2 is that it utilizes a light source which provides substantially more deep UV light output than known systems. Thus, the electrodeless light source converts approximately 7% of the electrical energy inputted to it to output in the deep UV part of the spectrum as opposed to only about 2% for the most widely used prior art source. Further, the electrodeless source delivers the output at the brightness levels which are required for suitable deep UV photoresist exposure.

This results in substantially faster exposure times than have heretofore been possible. For example, when the method and apparatus of the invention is used to expose photoresist in a multi-layer technique known as portable conformable mask, which is used to print submicrometer lines over profiled surfaces, exposure times of about 30 seconds are anticipated, contrasted with minutes, which the prior art system required.

Further, useful lamp operating lifetime is anticipated to be at least five hundred hours as opposed to only about a hundred hours for arc lamps while spectral output is more stable over bulb lifetime.

Additionally, as discussed in Lovering U.S. Pat. No. 3,569,083, an optical integrating means is necessary in the prior systems to uniformly redistribute the non-uniform light output of the arc before it is incident on the wafer. This integrating means is typically a fly's eye lens having multiple segments. However, as will be further developed below, since the electrodeless lamp is a volume source it emits radiation relatively uniformly in all directions, and thus in the apparatus of the present invention, it is believed that the optical integrating means may be dispensed with.

A further advantage of the present invention is that since the electrodeless lamp is a volume emitter it typically need not be critically positioned with respect to the optical coupling means. This is in distinction to arc lamps, in which the arc is effectively a point source, and thus must be critically positioned, for example at the focus of the elliptical reflector in the system of FIG. 1.

Figure 3:
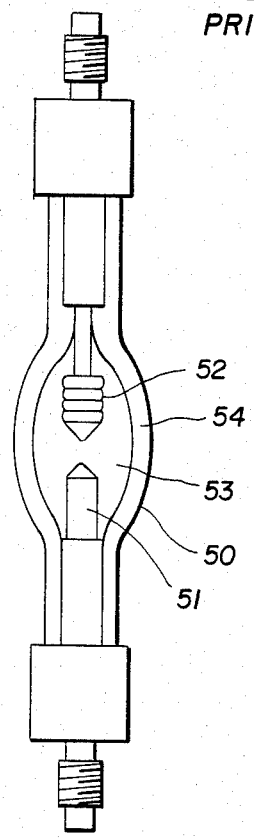
Figure 4:
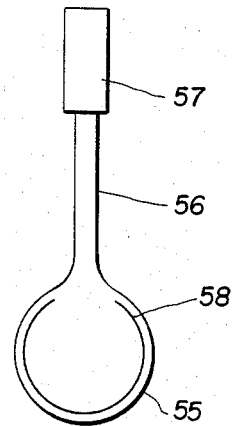
FIG. 4 is a schematic representation of an electrodeless lamp envelope and associated mounting means.

The above-described advantages to be gained from the use of the electrodeless lamp may be better understood by referring to FIGS. 3 and 4 which contrast the structure of the compact arc and electrodeless lamps respectively.

Referring to FIG. 3, the arc lamp is comprised of an envelope 50 in which a gas or mixture of gases, for example Hg and Xe reside at a relatively high pressure, and in which electrodes 51 and 52 are disposed. When a potential difference is applied across the electrodes, the gas therebetween becomes ionized, and a relatively compact arc discharge 53 occurs.

The region 54 between the discharge and the lamp wall is a cooler, neutral boundary layer of significant thickness. It is believed that this neutral boundary layer acts as a filter and absorbs some of the deep UV radiation which is emitted by the arc. Additionally, while deep UV production is favored by operation at lower pressure, arc lamps cannot be operated in such a regime because of the presence of the electrodes. Operation at lower pressures causes the electrodes to sputter, and the sputtered material is deposited on the lamp envelope, further decreasing light output and bulb lifetime.

FIG. 4 is an illustration of an electrodeless lamp bulb such as is used in the present invention. This bulb is comprised of envelope 55, typically of high quality quartz, which is filled with a plasma forming medium such as Hg, and which has attached to it a mechanical support 56 which is secured to a mounting fixture 57 for mounting the envelope in a microwave chamber. When microwave energy is fed into the chamber, the plasma forming medium in the envelope is excited substantially throughout the volume of the envelope and emits ultraviolet radiation having an outline which conforms to the envelope shape.

Since the electrodeless lamp is a volume source in which the plasma substantially fills the envelope, only a very thin neutral boundary layer 58 exists to separate the discharge from the envelope wall. It is believed that the thin boundary layer attenuates the deep UV to a substantially lesser extent than the thicker layer in the compact arc source. Also, since the envelope has no electrodes, operation in the deep UV-favoring low pressure regime and at high power density is possible, resulting in a bright deep UV output. Thus, operation at a Hg pressure of 1–5 atmospheres and at a power density of 250–1000 (watts/c.c) is possible. Operation at low pressure and at a microwave frequency of 2.45 Ghz causes the skin depth ($\epsilon$) to be relatively thin (less than the radius in a 0.75 inch diameter bulb), with the result that most of the microwave energy which is coupled to the envelope in the chamber is absorbed at the outer radii of the envelope volume, closer to the interior wall. This favors deep UV production since radiation which is emitted further to the interior of the envelope would be absorbed to a significant extent by the plasma which it must traverse to reach the envelope wall.

Figure 5:
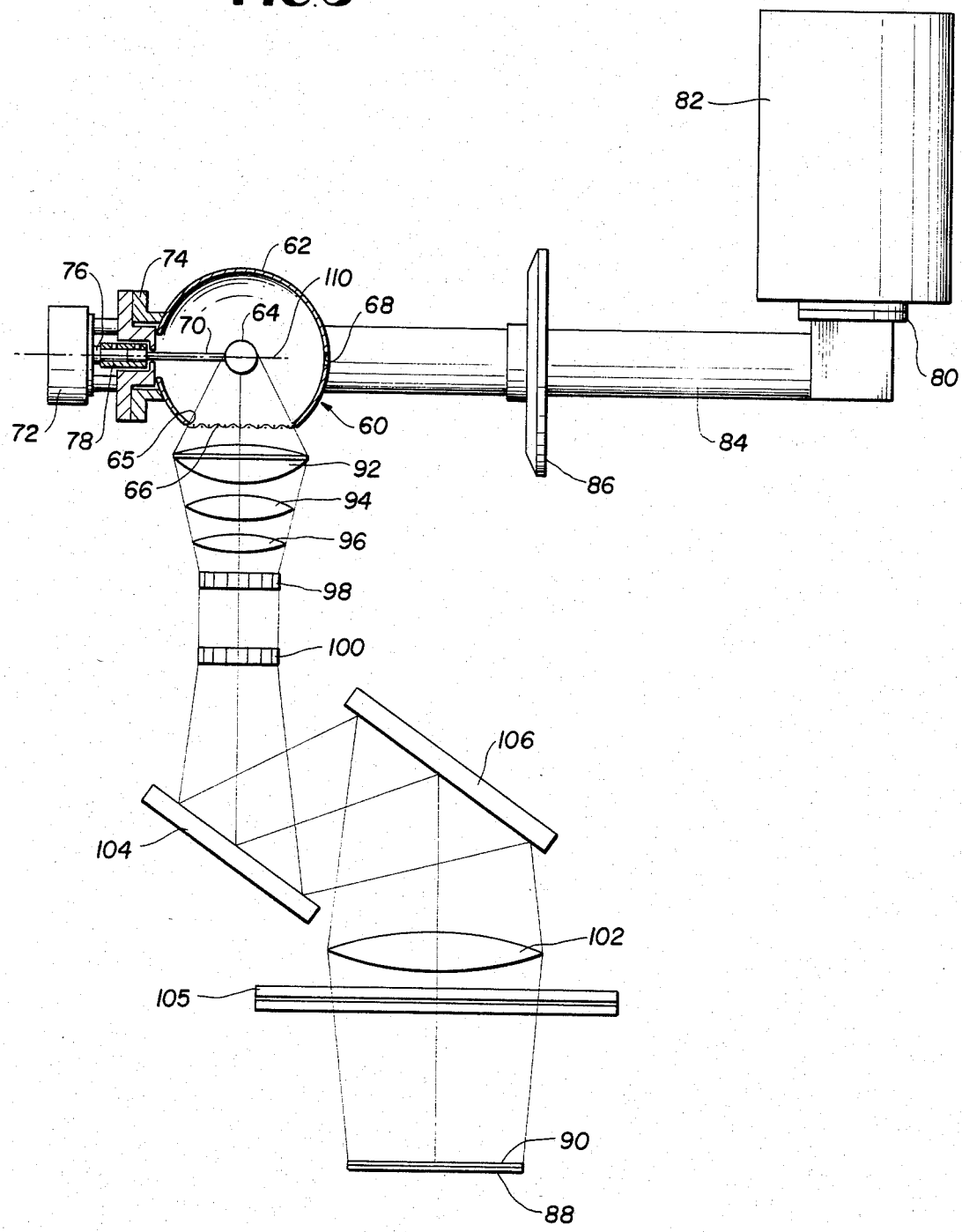
FIG. 5 is an illustration of a preferred embodiment of a system for performing deep UV photolithography in accordance with the present invention.

FIG. 5 is an illustration of a preferred embodiment of the invention for performing deep UV photolithography. Referring to the figure, electrodeless lamp 60 is shown, and is seen to be comprised of microwave chamber 62 and lamp envelope 64 which is disposed therein. The microwave chamber is comprised of a spherical portion having a circular aperture 65 and a plane, circular mesh portion 66 which is secured to the spherical portion over aperture 65. Both the spherical and mesh portions are made of a conductive material such as copper or aluminum. Additionally, a portion of the interior of the chamber may be coated with deep UV reflecting material.

The spherical portion of the chamber has a rectangular slot 68 in the position shown for coupling microwave energy. The lamp envelope 64 is spherical in shape and is disposed at the center of the spherical chamber. It is made of high purity quartz, which is a deep UV-transmissive material. The envelope has a quartz stem 70 secured thereto for mounting the envelope in the chamber. In order to effect cooling of the lamp envelope during operation, it is rotated while several streams of compressed air are directed at it, and the cooling system is shown in greater detail in FIG. 6.

Referring to FIG. 5, electric motor 72 is provided for rotating the lamp envelope. Motor mounting flange 74 is attached to the chamber, and motor 72 is secured to the flange. Shaft 76 of the motor is inserted into the left hand portion of ferrule 78 and is secured therein, for example by a set screw. Quartz stem 70 is secured in the right hand portion of ferrule 78, for example by cementing. Thus, stem 70 is effectively an extension of motor shaft 76, and the motor 72 is effective to rotate lamp envelope.

Microwave energy is generated by magnetron 80 which is energized by power supply 82. The generated energy is fed to the chamber 62 by rectangular waveguide section 84, which includes tuning stub 86 for optimizing coupling.

Spherical lamp envelope 64 is effectively a uniform emitter of radiation in the direction of the first lens, and it is the function of the optical train shown in the Figure to couple the ultraviolet radiation exiting from mesh 66 to wafer 88 as efficiently as possible. The mask 90 is disposed in contact with or in close proximity to wafer 88, making the system illustrated a contact or proximity system, although as indicated above the invention is applicable to other types of systems, including the projection type.

The optical train depicted is comprised of a condenser section which includes lenses 92, 94, and 96, an integrating section comprised of lenses 98 and 100, and a collimating section comprised of lens 102. Dichroic mirrors 104 and 106 are provided to remove the infrared and longer wave UV and visible components of the radiation by transmitting such component while reflecting the ultraviolet.

While the specific optical system illustrated forms no part of the present invention, it will be described in detail for the sake of completeness. Referring to FIG. 5, lens element 92 which has an aspheric surface is a paraboloid of revolution about the optical axis, and serves to minimize size and aberrations in the assembly. The second lens element is denoted by the numeral 94 and the third lens element 96 is a negative lens which allows the light to be collimated, but with a large clearance between the source and the first lens element.

The integrator lens assembly is comprised of fly's eye lenses 98 and 100, each of which is a segmented lens having 7 elements. Each element has a hexagonal shape so that the array has a central element which is surrounded by 7 others. Lens 98 is called the field lens and its shape can be significant in controlling uniformity at the wafer surface. Lens 100 is the objective of the integrator and is the same prescription as the nominal field lens, but differently oriented. In the assembly, the flat surfaces of the lenses face each other, and if it is necessary to change the size of the format at the wafer surface, the format diameter can be adjusted slightly by changing the spacing between these two elements. Thus, making the space smaller will cause the diameter to increase by roughly the change in the separation.

Finally, collimating lens 102 forms an image of the integrator field lens segments at the wafer surface. The collimator is large enough to fill the required diameter of the wafer surface with telecentric light cones from the preceding optics.

The light transferred by collimating lens 102 is fed through shutter 105 to mask 90 and photoresist-coated semiconductor wafer 88. The shutter is electrically operated, and is controlled to provide the desired dose of radiation to the semiconductor wafer.

In the preferred embodiment illustrated metallic chamber 62 is a 4 inch diameter sphere having a 2½ inch circular aperture which is covered by mesh 66. Mesh 66 is a grid of 0.0017 inch diameter wires having a spacing of 0.033 inches between wire centers. Spherical lamp envelope 64 is 0.75 inches in interior diameter and is filled with Hg, a noble gas such as argon, and HgCl. The argon fill is at relatively low pressure, and during operation the Hg is about 1–5 atmospheres while the argon is at about 100–200 torr. The purpose of the HgCl is to create a uniform boundary layer to keep the plasma off the lamp envelope wall. In order to obtain the appropriate operating pressure of Hg, a volume of approximately $2 \times 10^{-6}$ ml of liquid mercury is inserted to the bulb during manufacture.

Magnetron 80 provides about 1500 watts of microwave power at a frequency of 2450 Mhz. Substantially all, or the major part of this power is coupled to the microwave chamber, resulting in a power density of approximately 500 (watts/c.c.) in the preferred embodiment. The resulting light source has a conversion efficiency in the deep UV part of the spectrum of about 7%, and is a bright source which radiates at about 190 (watts/c.c.).

As highlighted above, the electrodeless lamp emits relatively uniform radiation. It is thus possible to eliminate the integrating lenses in FIG. 5, and with some modification of the remaining system to provide a uniform beam of light at the wafer plane even without such integrating elements.

Figure 6:
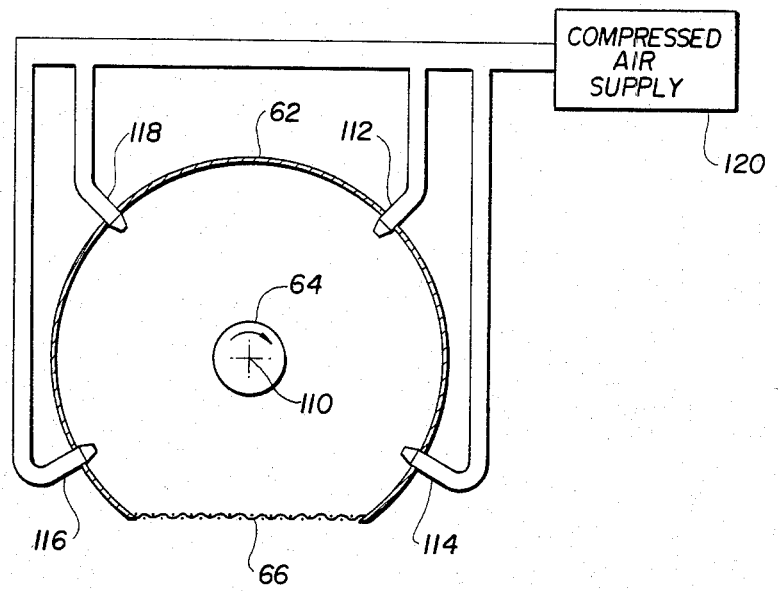
FIG. 6 is an illustration of a preferred embodiment of a cooling system for use in the apparatus of FIG. 5.

FIG. 6 is an illustration of the system used to cool lamp envelope 64 during operation. Since the power density in the envelope is very high it tends to get extremely hot during operation and additionally the cooling neutral boundary layer is thin in an electrodeless lamp, and does not provide a great cooling effect. It was found that conventional cooling technqiues, in which one or more streams of compressed air are directed at the envelope, were inadequate to cool the bulb sufficiently.

Consequently, the cooling system depicted in FIGS. 5 and 6 was designed, in which the lamp is rotated while one or more streams of compressed air are directed at it. Referring to the preferred embodiment of the cooling system illustrated in FIG. 6, the lamp is rotated around axis 110 which is coincident with stem 70 in FIG. 5, and compressed air jets directed at it by conduits 112, 114, 116 and 118, which are located in a plane which bisects the sphere and are fed by air supply 120. It is only by the expedient of rotating the bulb while cooling it with one or more jets that the occurrence of hot spots and consequent explosion of the bulb is avoided.

There thus has been disclosed a method and apparatus for performing deep UV photolithography which possesses the advantages which heretofore have been discussed in detail. Further, the techniques and lamp disclosed herein may find use in processes other than photolithography, which require deep UV irradiation of a substrate, such as, for example, photo-chemical thin film deposition. While a specific preferred embodiment has been illustrated and described, it should be understood that many variations falling within the scope of the invention will occur to those skilled in the art.

Therefore, it should be understood that the scope of the invention is defined only by the claims appended hereto, and equivalents.

We claim:

1. An apparatus for performing deep UV photolithography in which deep UV radiation is emitted from a light source at brightness levels which are sufficient to provide exposure of a deep UV photoresist at an exposure plane at substantially faster exposure times than have been afforded with deep UV arc lamp photolithography systems, and wherein said light source at said high deep UV brightness levels has a relatively long lifetime and requires replacement at only relatively infrequent intervals, comprising,
    microwave generated electrodeless light source means for emitting said deep UV radiation, wherein said light source means comprises,
        (a) an envelope containing a plasma forming medium,
        (b) microwave energy generating means for generating power at microwave frequencies,
        (c) means for coupling said generated microwave power to said envelope at power densities of at least 250 (watts/cc), and
    optical imaging means for imaging the bright deep UV radiation which is provided by said electrodeless light source at said exposure plane, for rapidly exposing a deep UV photoresist-coated substrate which may be disposed at said plane.

2. The apparatus of claim 1 wherein said microwave generated electrodeless light source means further includes a gaseous coupling medium between said microwave energy generating means and said envelope and wherein said means for coupling effects transfer of microwave energy through said gaseous coupling medium.

3. The apparatus of claim 1 further including,
    means for collimating the radiation provided by said source means, and
    means for controllably interrupting the radiation emitted by said source means to define a desired dose thereof.

4. The apparatus of claim 1 or 2 wherein said light source means further comprises a microwave chamber in which said envelope is disposed.

5. The apparatus of claim 4 wherein both said envelope and said microwave chamber are spherical in shape.

6. A microwave generated electrodeless light source for emitting radiation at relatively high brightness levels, comprising,
    a microwave chamber including a portion which does not allow microwaves to escape but which is relatively transmissive to said emitted radiation,
    a plasma-forming medium containing envelope disposed in said chamber,
    microwave energy generating means for generating power at microwave frequencies, and
    means for coupling said generated microwave power to said envelope in said chamber at power densities of at least 250(watts/cc), whereby said relatively bright radiation is emitted by said source.

7. The microwave generated electrodeless light source of claim 6 wherein there is a gaseous coupling medium between said microwave energy generating means and said envelope, and wherein said means for coupling effects transfer of microwave energy solely through said gaseous coupling medium.

* * * * *